(12) United States Patent
Yoon et al.

(10) Patent No.: US 8,455,360 B2
(45) Date of Patent: Jun. 4, 2013

(54) METHOD FOR FABRICATING STORAGE NODE OF SEMICONDUCTOR DEVICE

(75) Inventors: Hyo Geun Yoon, Yongin-si (KR); Ji Yong Park, Seoul (KR); Sun Jin Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 294 days.

(21) Appl. No.: 13/073,348

(22) Filed: Mar. 28, 2011

(65) Prior Publication Data

US 2012/0009790 A1    Jan. 12, 2012

(30) Foreign Application Priority Data

Jul. 7, 2010    (KR) .................. 10-2010-0065590

(51) Int. Cl.
*H01L 21/8242* (2006.01)
*H01L 21/44* (2006.01)

(52) U.S. Cl.
USPC ........... 438/675; 438/240; 438/244; 438/250; 438/253; 438/393; 438/396; 438/655; 438/647; 438/688; 438/680; 257/E21.018; 257/E21.019; 257/E21.021; 257/E21.158; 257/E21.281

(58) Field of Classification Search
USPC ............ 438/240, 244, 250, 253, 393, 396, 438/655, 675, 647, 688, 680, 785; 257/E21.018, 257/E21.019, E21.021, E21.158, E21.281, 257/E21.648

See application file for complete search history.

(56) References Cited

U.S. PATENT DOCUMENTS

| | | | |
|---|---|---|---|
| 6,696,338 B2 | 2/2004 | Oh et al. | |
| 2004/0110340 A1* | 6/2004 | Kim et al. | 438/253 |
| 2006/0141202 A1* | 6/2006 | Suenaga | 428/64.1 |
| 2006/0216884 A1* | 9/2006 | Choi | 438/240 |
| 2010/0325853 A1 | 12/2010 | Jie | |

FOREIGN PATENT DOCUMENTS

| | | |
|---|---|---|
| KR | 1020050024979 A | 3/2005 |
| KR | 1020050091120 A | 9/2005 |
| KR | 1020100044558 A | 4/2010 |

* cited by examiner

*Primary Examiner* — Mohsen Ahmadi
(74) *Attorney, Agent, or Firm* — William Park & Associates Patent Ltd.

(57) ABSTRACT

A method for fabricating a storage node of a semiconductor device includes forming a sacrificial dielectric pattern with a storage node hole on a substrate, forming a support layer on the sacrificial dielectric pattern, forming a storage node, supported by the support layer, in the storage node hole, performing a full dip-out process to expose the outer wall of the storage node, and performing a cleaning process for removing or reducing a bridge-causing material formed on the surface of the support layer.

15 Claims, 4 Drawing Sheets

METHOD FOR FABRICATING STORAGE NODE OF SEMICONDUCTOR DEVICE

CROSS-REFERENCES TO RELATED APPLICATIONS

The present application claims priority under 35 U.S.C 119(a) to Korean Application No. 10-2010-0065590, filed on Jul. 7, 2010, in the Korean intellectual property Office, which is incorporated herein by reference in its entirety set forth in full.

BACKGROUND

Exemplary embodiments of the present invention relate to a method for fabricating a semiconductor device, and more particularly, to a method for fabricating a storage node of a semiconductor device, which may reduce the occurrence of a bridge.

As an integration density of a semiconductor device increases, an area of a cell of the semiconductor device decreases. In particular, it becomes increasingly difficult to obtain a capacitance necessary for an operation of the semiconductor device including a capacitor (e.g., a dynamic random access memory (DRAM) device). In line with this trend, together with a thin film forming process for reducing a thickness of a dielectric layer, an attempt is continuously being made to increase the capacitance of the capacitor by forming a storage node (i.e., a bottom electrode of the capacitor) in a three-dimensional structure, for example, a cylindrical structure.

In order to form a cylindrical storage node, for example, a storage node hole is formed on a sacrificial dielectric pattern, and then a storage node layer is formed by forming a conductive material on the inner surface of the storage node hole, and performing an etching process. However, as the integration density of the semiconductor device increases, the interval between adjacent storage nodes decreases. This may cause a leaning phenomenon of the storage node, and thus a bridging phenomenon between the adjacent storage nodes may occur. In order to reduce the bridging phenomenon, a support pattern, e.g., a floating support pattern may be formed between the adjacent storage nodes by forming the support pattern on the sacrificial dielectric pattern between the adjacent storage nodes and removing the sacrificial dielectric pattern under the support pattern through a full dip-out process to form the floating support pattern.

However, during the full dip-out process, carbon and metal components, released from a metal layer constituting the storage node, may form a cluster and adhere to the top and bottom of the support pattern. The metal-carbon cluster may act as an electrical path between adjacent storage nodes.

SUMMARY

An embodiment of the present invention relates to a method for fabricating a storage node of a semiconductor device, which may effectively reduce a metal-carbon cluster adhered to the surface of a support layer by a dip-out process, when forming a cylindrical storage node that supports adjacent storage nodes by a support layer.

In an exemplary embodiment of the present invention, a method for fabricating a storage node of a semiconductor device includes forming a sacrificial dielectric pattern with a storage node hole on a substrate, forming a support layer on the sacrificial dielectric pattern; forming a storage node, supported by the support layer, in the storage node hole, performing a full dip-out process to expose the outer wall of the storage node, and performing a cleaning process for removing or reducing a bridge-causing material formed on the surface of the support layer supporting the top of the outer wall of the storage node through the full dip-out process.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

FIGS. 1 to 8 are cross-sectional views illustrating a method for fabricating a storage node of a semiconductor device according to an exemplary embodiment of the present invention.

Figure 1:
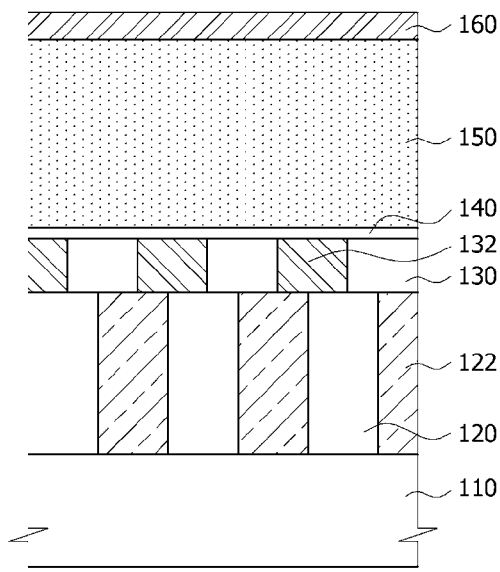
FIGS. 1 to 8 are cross-sectional views illustrating a method for fabricating a storage node of a semiconductor device according to an exemplary embodiment of the present invention.

Referring to FIG. 1, a first dielectric layer 120, having an impurity region (not illustrated), is formed on a semiconductor substrate 110, and a storage node contact 122 is formed in the first dielectric layer 120 to be electrically connected to the impurity region of the semiconductor substrate 110. The storage node contact 122 may be formed of a polysilicon layer. Next, a second dielectric layer 130 is formed on the first dielectric layer 120 and the storage node contact 122, and a landing pad 132 is formed in the second dielectric layer 130 to be electrically connected to the storage node contact 122. The landing pad 132 may reduce the contact resistance of the top surface of the storage node contact 122. The landing pad 132 may be formed of a polysilicon layer, and also may not be formed.

An etch stop layer 140 is formed on the second dielectric layer 130 and the landing pad 132. The etch stop layer 140 may be formed of a nitride layer with a thickness of approximately 400 Å to approximately 800 Å. A sacrificial dielectric layer 150 is formed on the etch stop layer 140. The etch stop layer 140 and the sacrificial dielectric layer 150 may be formed of materials having a sufficient etch selectivity with respect to each other. For example, if the etch stop layer 140 is formed of a nitride layer, the sacrificial dielectric layer 150 may be formed of an oxide layer. In this case, the sacrificial layer 150 is formed of an oxide layer containing carbon components. For example, the oxide layer includes a phosphosilicate (PSG) layer or a tetraethyl orthosilicate (TEOS) layer. The sacrificial dielectric layer 150 is formed to a thickness of approximately 14,000 Å to approximately 19,000 Å. Next, a support layer 160 is formed on the sacrificial dielectric layer 150. For example, the support layer 160 is formed of a nitride layer with a thickness of approximately 400 Å to approximately 15,000 Å.

Figure 2:
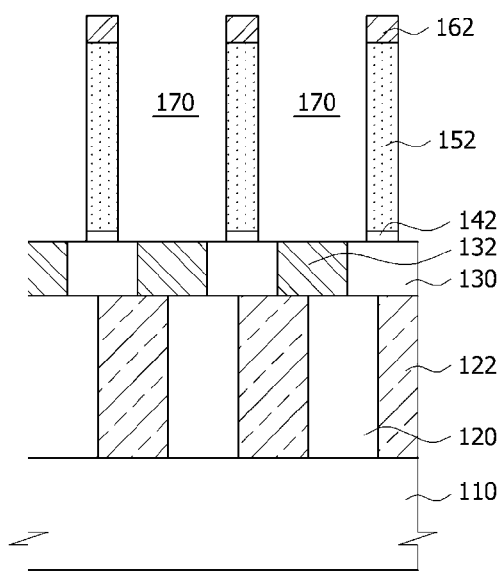

Referring to FIG. 2, an etching process using a mask pattern (not illustrated) is performed to remove a portion of the support layer 160, the sacrificial dielectric layer 150 and the etch stop layer 140, thereby forming a support pattern 162, a sacrificial dielectric pattern 152 and an etch stop pattern 142 having a storage node hole 170 therethrough. The top surface of the landing pad 132 is exposed by the storage node hole 170.

Figure 3:
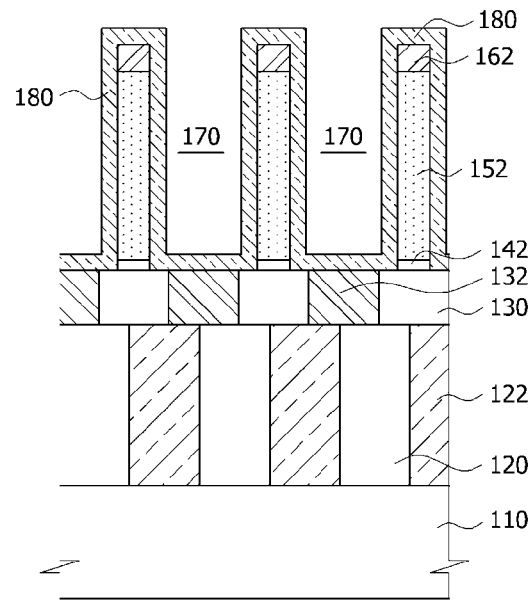

Referring to FIG. 3, a conductive layer 180 is formed over the resulting structure including the storage node hole 170. The conductive layer 180 may be formed of a metal/metal nitride layer, for example, a titanium/titanium nitride (Ti/TiN) layer. According to an example, the conductive layer 180 may be formed of a single metal layer or a single metal nitride layer. Although not illustrated in the drawings, if the conductive layer 180 is formed of a metal/metal nitride layer, a titanium layer may be formed and a thermal treatment process may be performed thereon to form a titanium silicide ($TiSi_2$) layer (not illustrated) on the contact surface between the titanium layer and the landing pad 132. Then, a first cleaning process using a mixed solution of $NH_4OH$, $H_2O_2$ and $H_2O$ (i.e., an SC-1 (Standard Cleaning-1) cleaning solution) at room temperature and a second cleaning process using ozone ($O_3$) are performed continuously in a single wafer cleaning equipment. Here, the first cleaning process using an SC-1 cleaning solution is performed to remove/reduce the titanium contacting the sacrificial dielectric pattern 152, and the second cleaning process using ozone is performed to remove/reduce the carbon (C) components from the surface of the conductive layer 180. In the process of forming a titanium silicide layer between the titanium layer and the landing pad 132, a titanium silicide layer (not illustrated) may also be formed on the contact surface between the titanium layer and the sacrificial dielectric pattern 152. Thus, not all but a portion of the titanium layer contacting the sidewall of the sacrificial dielectric pattern 152 is removed, but the amount of a titanium source causing a titanium-carbon cluster formed by the subsequent full dip-out process may decrease.

Figure 4:
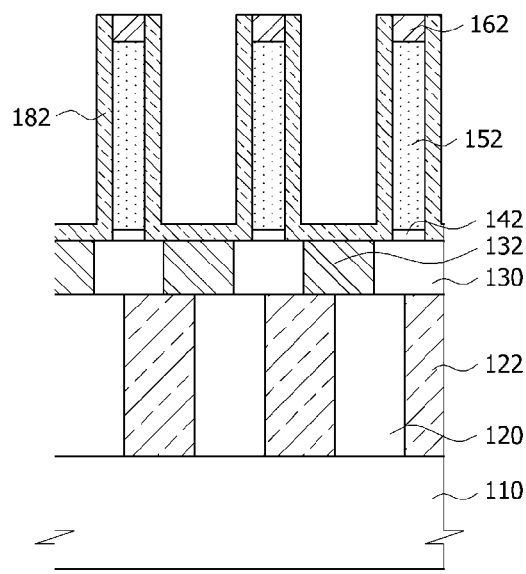

Referring to FIG. 4, a certain thickness of the top of the conductive layer 180 is removed to expose the top surface of the support pattern 162. For example, this process may be performed through a chemical mechanical polishing (CMP) process to form a storage node 182. The storage node 182 has an outer wall contacting the outer walls of the support pattern 162 and the sacrificial dielectric pattern 152, and a bottom surface contacting the landing pad 132.

Figure 5:
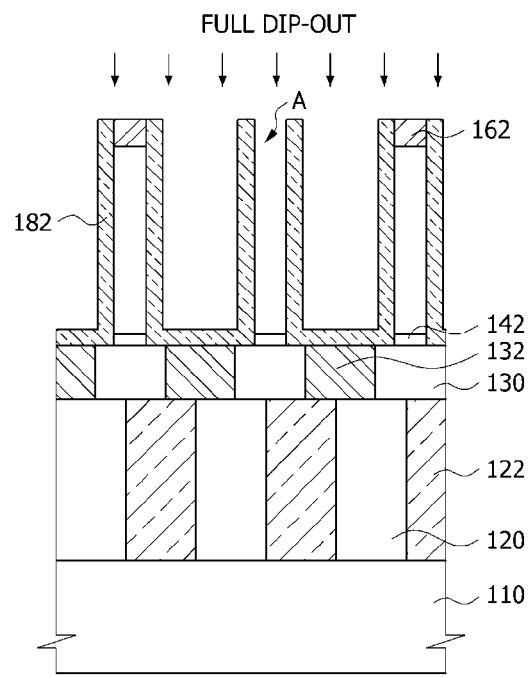

Referring to FIG. 5, a full dip-out process is performed to remove the sacrificial dielectric pattern 152. To this end, a portion (denoted by 'A') of the support pattern 162 on the sacrificial pattern 152 may be removed before performing the full dip-out process of the sacrificial dielectric pattern 152 to expose a portion of the sacrificial dielectric pattern 152. In this state, when a full dip-out process is performed, an etching solution is supplied to the exposed sacrificial dielectric patterns 152 to remove the sacrificial dielectric patterns 152. Here, the etching solution may include a buffer oxide etchant (BOE). Further, It is illustrated that the sacrificial dielectric patterns 152 are divided, but the sacrificial dielectric patterns 152 may be connected to each other by surrounding the outer wall of the cylindrical storage node 182.

Figure 6:
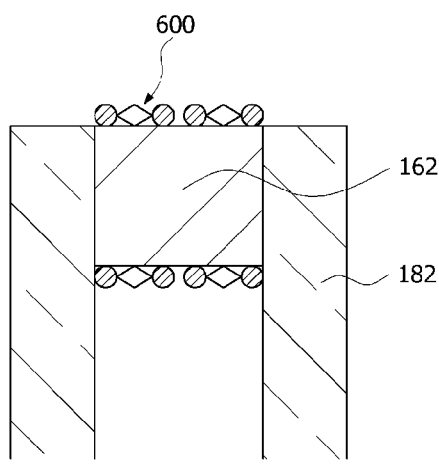

In the full dip-out process for removing the sacrificial dielectric pattern 152, the metal (e.g., titanium (Ti)) in the storage node 182 and the carbon (C) in the sacrificial dielectric pattern 152 may form a cluster and adhere to the bottom surface and the top surface of the support pattern 162, as illustrated in FIG. 6. The titanium-carbon cluster 600 should be removed because it becomes a bridge-causing material by acting as an electrical path between the adjacent storage nodes 182. In order to remove the bridge-causing material, the present invention performs a first cleaning process and a second cleaning process continuously in a single wafer cleaning equipment.

Figure 7:
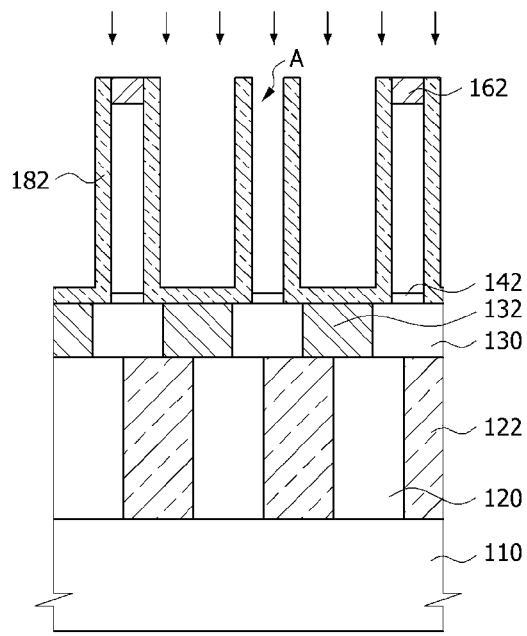

Specifically, a first cleaning process using an SC-1 (Standard Cleaning-1) cleaning solution is performed as represented by arrows in FIG. 7. The SC-1 cleaning solution may be a mixed solution of $NH_4OH$, $H_2O_2$ and $H_2O$. The volume percentage (vol %) of the mixed solution of $NH_4OH$, $H_2O_2$ and $H_2O$ may range from approximately 1:4:20 to approximately 1:5:80. The first cleaning process may be performed at room temperature, for example, at temperatures of approximately 20° C. to approximately 30° C. The first cleaning process may melt and remove the titanium (Ti) of the titanium-carbon cluster 600. If the first cleaning process and the second cleaning process are performed after the forming of the titanium silicide layer as described with reference to FIG. 3, the amount of titanium that is the source material of the titanium-carbon cluster 600 may decrease, thus further enhancing the titanium removal effects in this process.

Referring to FIG. 7, a first cleaning process using an SC-1 (Standard Cleaning-1) cleaning solution is performed as represented by arrows.

The first cleaning process may be performed at room temperatures of approximately 20° C. to approximately 30° C. because it is performed using an SC-1 cleaning solution. Therefore, the titanium may be removed/reduced more efficiently, as compared to the case of using other cleaning solution at high temperatures. For example, in the case of using an SPM (Sulfuric-Peroxide Mixture) cleaning solution, the cleaning process is performed at high temperatures of approximately 80° C. or more. This may increase the concentration of titanium in a cleaning vessel, thus causing an error in the measurement of the concentration of $H_2O_2$ in the SPM cleaning solution. Accordingly, the amount of $H_2O_2$ may not be controlled, thus making it difficult to accurately control the titanium-carbon cluster removing process. However, this exemplary embodiment may reduce such a problem because it performs the first cleaning process using an SC-1 cleaning solution at room temperature. According to embodiments, after the performing of the first cleaning process, a plasma nitridation process may be performed to remove the remaining carbon.

Figure 8:
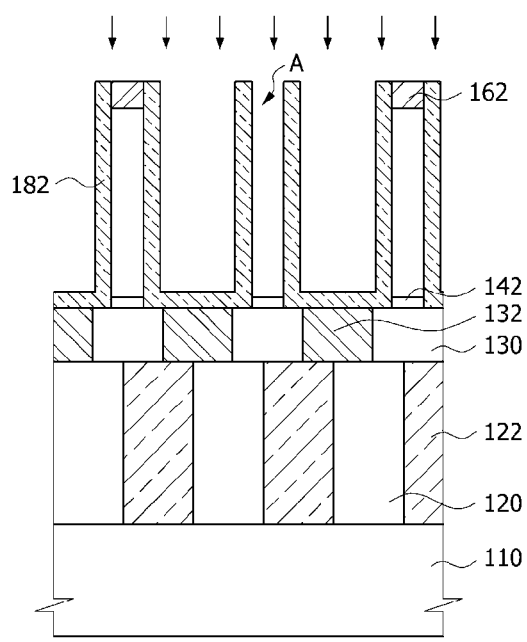

Referring to FIG. 8, a second cleaning process using ozone is performed as represented by arrows. The second cleaning process may be performed at temperatures of approximately 10° C. to approximately 30° C. The ozone concentration may range from approximately 5 ppm to approximately 100 ppm. The carbon components of the titanium-carbon cluster 600 may be removed/reduced by the second cleaning process. In this embodiment, the second cleaning process is performed after the first cleaning process. However, in other embodiments, the first cleaning process may be performed after the second cleaning process. Also, one of the first cleaning process and the second cleaning process may be omitted according to the required design rule. In this exemplary embodiment, the first cleaning process and the second cleaning process are performed continuously in a single wafer cleaning equipment. However, in other embodiments, the first cleaning process and the second cleaning process may be performed in a batch-type cleaning equipment according to the required design rule.

As described above, according to the present invention, the first cleaning process using an SC-1 cleaning solution and the second cleaning process using ozone are performed after the performing of the dip-out process for removing the sacrificial dielectric pattern, the metal-carbon cluster adhered to the surface of the support layer may be removed/reduced more efficiently. In particular, a certain portion of the storage node is removed by the first cleaning process and the second cleaning process to facilitate the subsequent dielectric layer deposition, thereby leakage current characteristics of the capacitor may be improved.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for fabricating a storage node of a semiconductor device, comprising:
    forming a sacrificial dielectric pattern with a storage node hole on a substrate; and then
    forming a support layer on the sacrificial dielectric pattern; and then
    forming a storage node, supported by the support layer, in the storage node hole; and then
    performing a full dip-out process to expose the outer wall of the storage node; and then
    performing a cleaning process for removing or reducing a bridge-causing material formed on the surface of the support layer; and then
    forming a metal silicide layer under the bottom of the storage node; and then
    performing a first cleaning process using a mixed solution of $NH_4OH$, $H_2O_2$ and $H_2O$ at room temperature and then a second cleaning process using ozone, after the forming of the metal silicide layer.

2. The method of claim 1, wherein the sacrificial dielectric pattern comprises an oxide layer containing carbon components.

3. The method of claim 2, wherein the oxide layer comprises a phosphosilicate (PSG) layer or a tetraethyl orthosilicate (TEOS) layer.

4. The method of claim 2, wherein the support layer comprises a nitride layer.

5. The method of claim 1, wherein the storage node comprises a titanium nitride layer.

6. The method of claim 1, wherein the storage node comprises a titanium layer/a titanium nitride layer.

7. The method of claim 1, wherein the bridge-causing material comprises a metal-carbon cluster that is a combination of the metal in the storage node and the carbon in the sacrificial dielectric pattern.

8. The method of claim 7, wherein the metal-carbon cluster comprises a titanium-carbon cluster.

9. The method of claim 8, wherein the cleaning process comprises:
    a first cleaning process using a mixed solution of $NH_4OH$, $H_2O_2$ and $H_2O$ at room temperature; and
    a second cleaning process using ozone.

10. The method of claim 9, wherein the first cleaning is performed at temperatures of approximately 20° C. to approximately 30° C.

11. The method of claim 9, wherein the volume percentage (vol %) of the mixed solution of $NH_4OH$, $H_2O_2$ and $H_2O$ ranges from approximately 1:4:20 to approximately 1:5:80.

12. The method of claim 9, wherein the second cleaning is performed at temperatures of approximately 10° C. to approximately 30° C.

13. The method of claim 9, wherein the ozone concentration ranges from approximately 5 ppm to approximately 100 ppm.

14. The method of claim 9, wherein the first cleaning and the second cleaning are performed continuously in a single wafer cleaning equipment.

15. The method of claim 9, further comprising:
    performing a plasma nitridation process after the performing of the first cleaning process.

* * * * *